United States Patent
Rahman

(10) Patent No.: US 7,050,515 B2
(45) Date of Patent: May 23, 2006

(54) FRONT END AUTOMATIC GAIN CONTROL CIRCUIT USING A CONTROL WORD GENERATOR

(75) Inventor: Syed Habib Rahman, Campbell, CA (US)

(73) Assignee: Terayon Communication Systems, Inc., Santa Clara, CA (US)

( * ) Notice: Subject to any disclaimer, the term of this patent is extended or adjusted under 35 U.S.C. 154(b) by 920 days.

(21) Appl. No.: 09/999,060

(22) Filed: Nov. 15, 2001

(65) Prior Publication Data

US 2003/0092410 A1    May 15, 2003

(51) Int. Cl.
*H04L 27/08* (2006.01)
*H04B 3/00* (2006.01)

(52) U.S. Cl. ..................... 375/345; 375/257
(58) Field of Classification Search ............ 375/317, 375/345; 455/232.1–253.2
See application file for complete search history.

(56) References Cited

U.S. PATENT DOCUMENTS

| | | | |
|---|---|---|---|
| 6,735,422 B1 * | 5/2004 | Baldwin et al. | 455/232.1 |
| 6,904,273 B1 * | 6/2005 | Steber et al. | 455/234.1 |

* cited by examiner

Primary Examiner—Kevin Kim
(74) Attorney, Agent, or Firm—Thelen Reid & Priest LLP

(57) ABSTRACT

A control word generator comprised of circuitry to generate a control word to control an attenuator. The control word generator includes a counter that increments at a clock rate much higher than the refresh rate at which the error signal is recalculated. The counter is controlled by a comparator which compares the error signal to a reference value, which, starting from a programmable upper limited is decremented in the counter's incrementation rate by a programmable step size. When the reference value equals the error signal, the comparator changes state and the counter stops incrementing. The count at that time is the control word, which if everything operated instantaneously, would be the control word that would alter the attenuation sufficiently to achieve nominal power. Also disclosed is a method to use this apparatus to generate a table of control words comprising: first establish an input power level and attenuate the signal with an analog variable attenuator/amplifier; second, measuring the output power of the signal output by said variable attenuator/amplifier; third, use a control word generator to iteratively derive a control word, which will cause the input signal power to be altered to the nominal power level; fourth, record that control word; fifth, increment the input signal power and repeat the process to derive a new control word and record that word; and, sixth, repeat the entire process for each level of expected input signal power.

6 Claims, 4 Drawing Sheets

FRONT END CALIBRATION

FRONT END CALIBRATION

FRONT END AUTOMATIC GAIN CONTROL CIRCUIT USING A CONTROL WORD GENERATOR

BACKGROUND OF THE INVENTION

Many digital communication systems like wireless systems and cable modem systems use hybrid automatic gain control circuits with an analog portion and a digital portion. These systems do calibration and error control in the digital circuitry, and apply the gain correction derived by the digital circuitry to the analog gain control circuitry.

The headend transceiver in DOCSIS cable modem systems, must be able to receive transmissions from many different cable modems at different distances. Each cable modem sends bursts of data that are quadrature amplitude modulated at a power level that is specified by the headend transceiver. It is important to control the gain of the received signal so that it does not saturate the front end analog circuitry and so that the received signal from each cable modem falls within the dynamic range of analog-to-digital converters which digitize the received signals. The amplitude of each received constellation point is an important piece of information since the position of each constellation point in the constellation of possible points that can be transmitted is controlled by both the point's amplitude and phase. These two coordinates control the position, and the position represents the digital bits that were sent when that constellation point is received.

However, during normal DOCSIS operations, the headend transceiver controls the transmit power of the cable modems so that their bursts arrive at a nominal power level within the dynamic range of the headend receiver's A/D converter. During normal operation, there is no need for an automatic gain control of the type disclosed herein.

Headend receivers in cable modem systems typically have a front end comprised of an analog attenuator that receives signals from the hybrid fiber coax and outputs a signal which has been attenuated by a specific amount to an A/D converter. The amount of attenuation by the analog attenuator is controlled by an analog control voltage input. Each analog attenuator applies a different amount of attenuation based upon the same control word because of variations in the manufacturing process from one lot to the next. How much attenuation the analog attenuator imposes for each different level of control word voltage must be known before the headend transceiver is placed into service. This is important so that the cable system operator will be able to precisely control the attenuation by applying the appropriate control voltage. A system for generating an attenuation table that can be used to generate the proper control voltages to cause a specified amount attenuation to be imposed during actual operation is therefore needed. This creates a need for a control word generator that can be used during manufacture to generate a control word table that contains the proper control word for each desired level of attenuation.

SUMMARY OF THE INVENTION

The genus of the control word generator invention is defined by the following characteristics which all species will share. First, there must be circuitry to determine how much alteration in the present level of attenuation is needed to alter the input signal power such that nominal power is achieved. That need for alteration of the present level of attenuation is expressed as an error signal. Second, there must be circuitry to generate a control word which will cause sufficient alteration of the present level of attenuation to reduce the error signal to zero. Finally, circuitry is needed to store the control word so determined for every level of input power.

In the preferred embodiment, the circuitry to generate the control word includes a counter that increments at a clock rate much higher than the refresh rate at which the error signal is recalculated. The counter is controlled by a comparator which compares the error signal to a reference value, which, starting from a programmable upper limited is decremented in the counter's incrementation rate by a programmable step size. When the reference value equals the error signal, the comparator changes state and the counter stops incrementing. The count at that time is the control word, which if everything operated instantaneously, would be the control word that would alter the attenuation sufficiently to achieve nominal power. In reality, things do not operate instaneously, and the error signal will start falling and several cycles of the refresh clock that recalculates the error signal may occur while the error signal is falling toward zero. During those several cycles, the iterative process to derive a control word will occur during each refresh clock cycle. However, eventually, the error signal will stop falling and the system will stabilize at a control word which holds the error signal at zero for the current level of input signal power. That final control word is stored.

There is an inventive method to use this apparatus to generate a table of control words for use in controlling an analog attenuator at the front end of a digital data receiver such as a cable modem or headend cable modem termination system or the headend of a cellular phone system, etc. The genus of methods that incorporate this aspect of the invention is characterized by the following characteristics. A method within this genus will: first establish an input power level and attenuate the signal with an analog variable attenuator/amplifier which applies positive or negative gain according to a control signal; second, measuring the output power of the signal output by said variable attenuator/amplifier; third, use a control word generator within the genus described above to iteratively derive a control word, which, when converted to a control signal to control the level of attenuation/amplification of the analog variable attenuator/amplifier, will cause the input signal power to be attenuated or amplified to the nominal power level; fourth, record that control word; fifth, increment the input signal power and repeat the process to derive a new control word and record that word; and, sixth, repeating the entire process for each level of expected input signal power.

DETAILED DESCRIPTION OF THE PREFERRED AND ALTERNATIVE EMBODIMENTS

Figure 1:
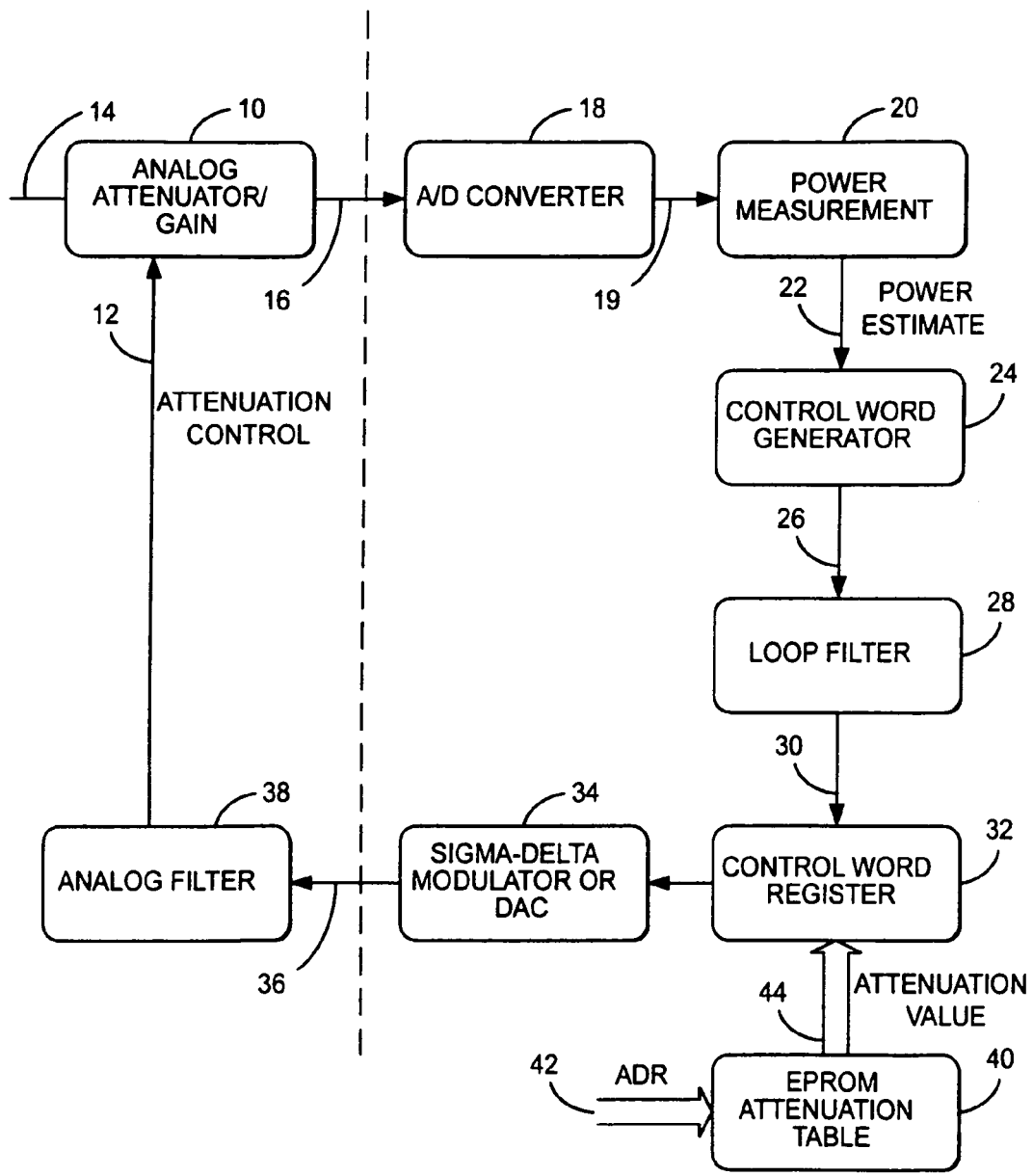
FIG. 1 is a block diagram of a front end automatic gain control system which can be used in closed loop mode to generate a calibration table for the analog attenuator during manufacture and can be used in open loop mode during actual operation of whatever system in which it is installed.

Referring to FIG. 1, there is shown a block diagram of a front end automatic gain control system which can be used in closed loop mode to generate a calibration table for the analog attenuator during manufacture and can be used in open loop mode during actual operation of whatever system in which it is installed. When the system of FIG. 1 is used in some applications such as a subscriber cable modem however, it can be used in closed loop mode. The entire system of FIG. 1 is installed in the receiver of a system to receive digital data, and is used in closed loop mode during the calibration process during manufacture, and is used in open loop mode during actual operation of the receiver. In the preferred embodiment, FIG. 1 is a block diagram of the calibration system used to generate a calibration table for control of the analog attenuator 10 in a headend receiver of a cable modem system.

Figure 3:
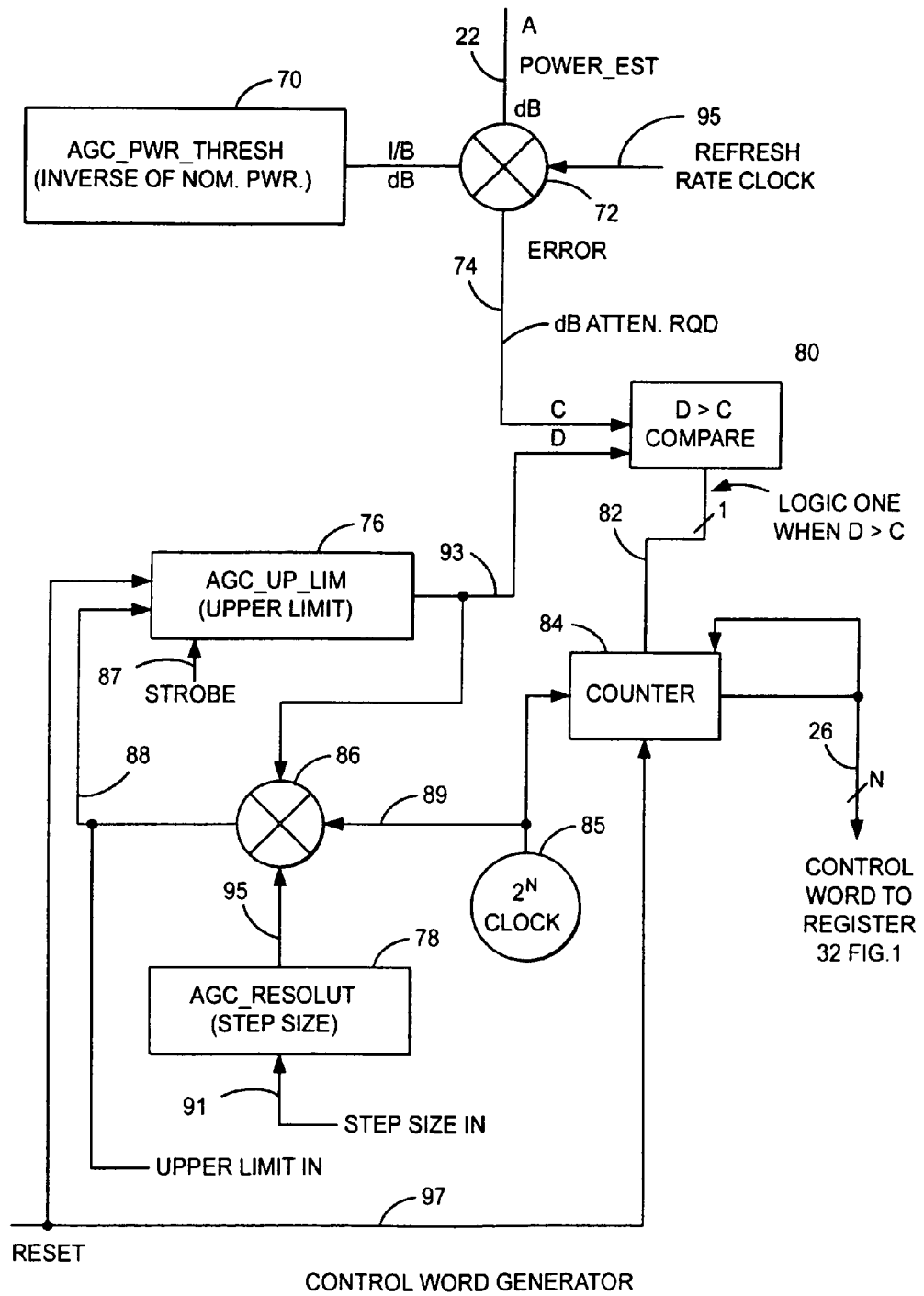
FIG. 3 is a block diagram of a control word generator according to the teachings of the invention.

Although circuits of the type shown in FIG. 1 without the control word generator 24 are believed to be in the prior art, the particular control word generator circuit 24 present in FIG. 1 and detailed in the block diagram of FIG. 3 is believed to be novel. The way these prior art circuits without the control word generators work is to subtract a reference power from the power estimate generated by the power measurement circuit 20 to generate an error signal which is then converted by the rest of the circuitry shown to a control voltage on line 12 which tends to alter the attenuation toward a state where the error signal is zero. The problem with this prior art approach is that it is linear and it is very slow. If this type of prior art system needs to make a big change in attenuation, the reference power is changed and it takes some appreciable time for the system to slew to that new level of attenuation. The problem with a slow slew rate is that it takes the receiver longer to lock onto the signal and start getting correct results from decoding of the known preamble symbols of each burst. Further, such a prior art system has no flexibility to alter resolution of steps of attenuation or dynamic range of attenuation that can be applied.

One advantage of the invention is that a large dynamic range of attenuation by the analog attenuator may be established by proper selection of the control words. The large flexibility in dynamic range means the system of the invention can be used in many more applications where the need for attenuation varies greatly from one application to another. For example, the attenuation needs in a cellular system are much different than the attenuation needs in an HFC system. Another advantage of the invention is that the dynamic range does not have to be symmetric. In other words, the attenuation range can be set from +20 dB to −10 dB instead of from +15 to −15 dB. Another advantage of the invention is that the resolution step size from one control word to the next is flexible and can be altered by generating a new control word table.

The system of FIG. 1 is comprised of an analog attenuator/gain stage 10 (hereafter just referred to as the analog attenuator) which is to be installed in a headend transceiver and for which the system of FIG. 1 derives the control word values in an attenuation table 40. The purpose of the analog attenuator 10 is to apply a selectable amount of attenuation or supply a selectable amount of gain to the input signal on line 14 so as to achieve a desired nominal power on line 16. The amount of attenuation or gain is controlled by an attenuation control signal on line 12.

It is important to achieve a certain nominal power on line 16 because if the signal power there is too high, the A/D converter 18 will clip which will cause loss of resolution between different constellation points. Likewise, if the signal power on line 16 is too low, the full dynamic range of the A/D converter 18 will not be utilized. Thus, the overall function of the system of FIG. 1, in closed loop mode (switch 30 closed), which happens during final calibration of the attenuation factors of whatever system the circuitry of FIG. 1 is to be operated in, is to develop a table of control words which can be used to precisely control the attenuation of the analog attenuator when operating in open loop mode with switch 30 open. This table, in open loop mode with switch 30 open, can be used to call up an appropriate control word from table 40 given a certain input power on line 14, such that when the control word so accessed is stored in control word register 32 and used to generate a control signal on line 12, the analog attenuator 10 will supply adequate attenuation or gain to cause the output power on line 16 to be the desired nominal power.

The entire circuit shown in FIG. 1 is installed in a headend transceiver, but the circuit is operated in closed loop mode during calibration and is operated in open loop mode during normal operation of the headend transceiver. Closed loop mode is achieved by closing switch 30. Open loop mode is achieved by opening switch 30.

The analog attenuator has a voltage control input 12 at which an analog attenuation control voltage is applied. The attenuator 10 attenuates the signal on line 14 by an amount controlled by the control signal on line 12 and outputs the resulting signal on line 16 to the input of an analog-to-digital converter 18.

The A/D converter 18 outputs its digital samples to a power measurement circuit 20 which measures the power of each burst to determine how much attenuation occurred in attenuator 10. The analog attenuator 10 can any analog attenuator with any dynamic range with the amount of attenuation controlled by the voltage on line 12.

The power estimate number measured by 20 is output on line 22 to a control word generator 24. The control word generator generates a control word on line 26 that is a digital representation of the amount of attenuation that occurred in analog attenuator 10. This control word passes through loop filter 28 and switch 30 (which is closed during closed loop calibration operations) and is stored in a control word register 32.

The control word is read by a sigma-delta modulator 34 which converts the control word to a pulse train on line 36 which has a duty cycle commensurate with the value of the control word. An analog filter 38 integrates the pulse train and converts it to the analog control voltage on line 12.

The analog attenuator needs calibration to generate a calibration table so that a cable operator can control precisely how much attenuation the analog attenuator 10 imposes during normal open loop operation.

Once the calibration process is completed, the control word table is complete and can be used to control the amount of attenuation attenuator 10 imposes during normal open loop operation. The control words of the control word table are stored in EPROM 40 which are developed during the calibration process. The operator can select one of them by supplying its address on bus 42. This causes the control word to be output on bus 44 for storage in control register 32. The control words in attenuation table 40 are developed during the calibration process which will be described next.

Manner of Using Circuit of FIG. 1 During Calibration

During manufacture of the headend transceiver, the system of FIG. 1 is operated in closed loop mode. The closed loop mode is used to develop the data in the attenuation table 40 for the particular analog attenuator 10. The analog attenuators vary from one to the other in what attenuation they create for a given control voltage input on line 12. The basic idea in the calibration process is to measure the attenuation of the attenuator 10 and to develop a control word for each different desired level of attenuation so that if the operator wants 10 dB of attenuation during normal open loop operation, the proper control word to achieve that can be selected from the attenuation table 40 and written into the control word register 32.

Figure 2A:
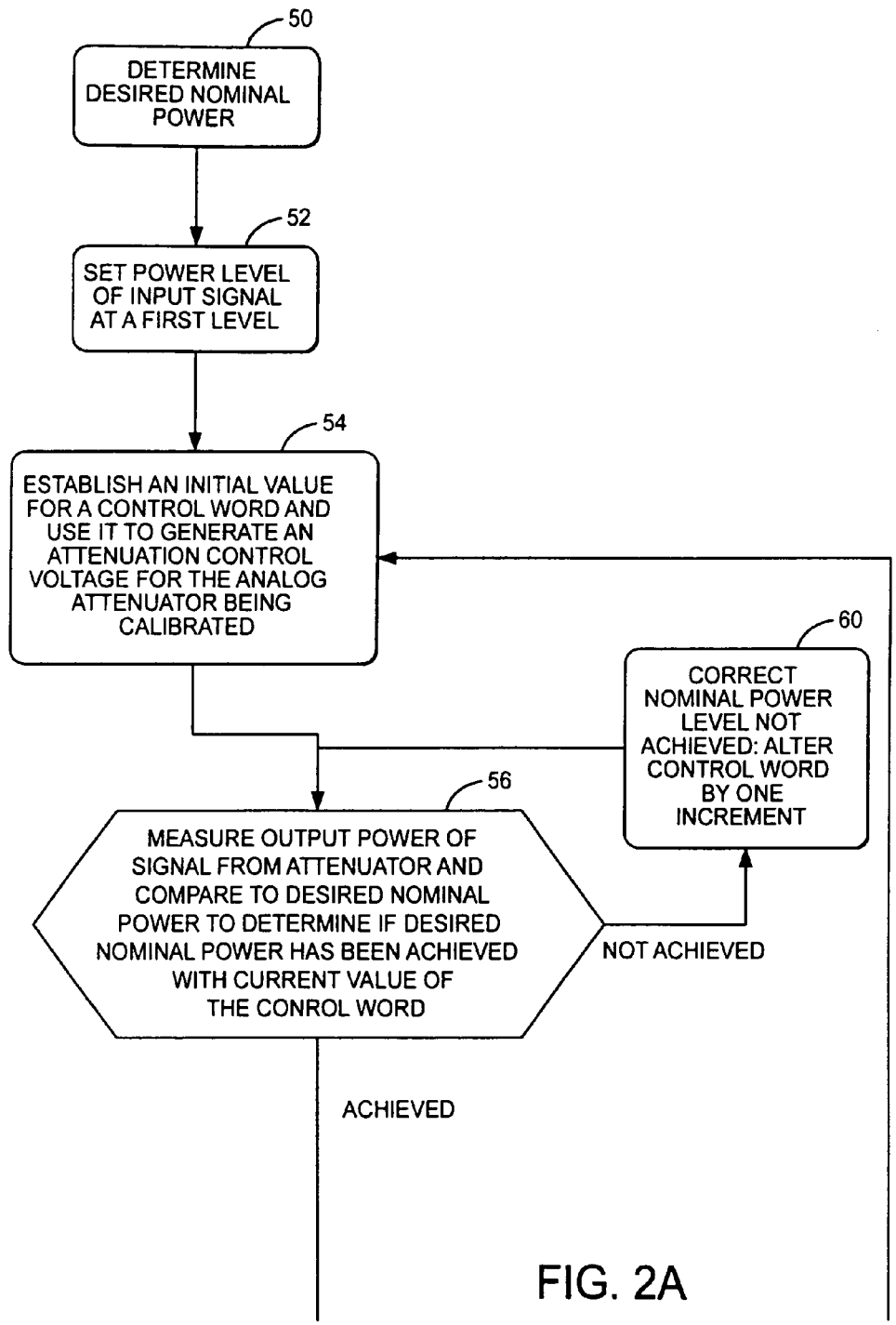
FIGS. 2A and 2B are a flowchart of a process to calibrate an analog attenuator during manufacture.
Figure 2B:
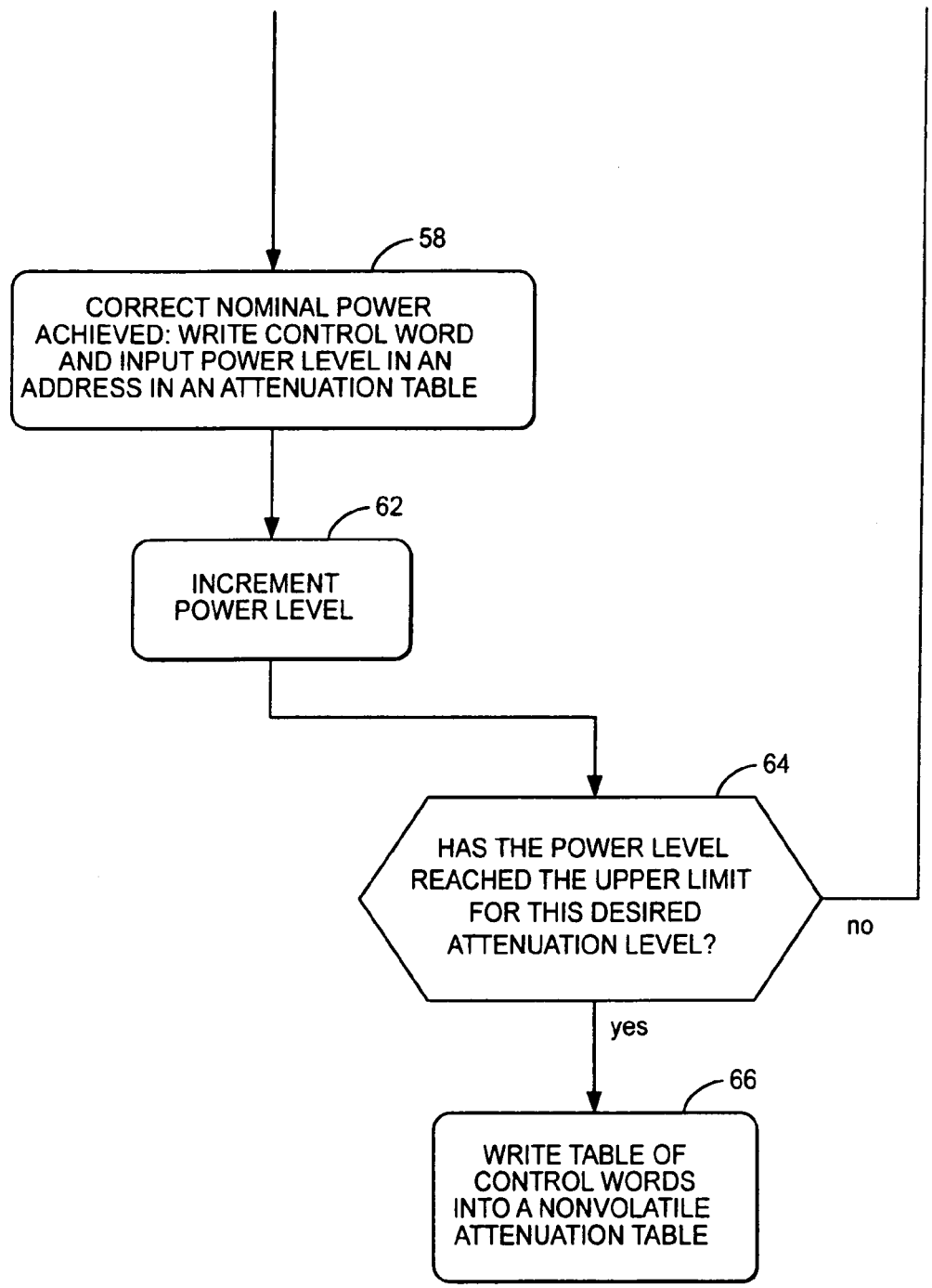

The way this is done is illustrated in flowchart form in FIGS. 2A and 2B. The first step 50 is to determine a desired nominal power to be achieved by use of analog attenuator/gain stage 10 to impose attenuation or supply gain to the signal on line 14. The nominal power is the desired power level on line 16 in FIG. 1 and this power level determines how much attenuation the attenuator should apply given some level of input power. Next, in step 52, a first signal having some initial power level is input on line 14. Step 54 represents the step of establishing an initial value for a control word in register 32 of FIG. 1. The control word generator generates this control word and stores it in register 32. Then this control word is converted to the attenuation control signal on line 12 using the sigma-delta modulator or DAC 34 in FIG. 1 which causes the attenuator 10 to supply whatever gain or attenuation that maps to that particular control word. This alters the power level of the signal on line 14 to some new power level on line 16.

The output signal on line 16 is digitized in the A/D converter 18 in FIG. 1 and the power of the signal represented by the samples on line 19 is measured by power measurement circuit 20, as represented by step 56. the power measurement circuit 20 outputs the measured power as the power estimate on line 22. The control word generator 24 in FIG. 1 then determines if the power output on line 16 has the desired nominal power using the current control word. If the power on line 16 is the desired nominal power, step 58 is performed which writes the current control word in register 32 along with the input power level into an address of an attenuation table. In this way, during operation of the receiver in the field, when an input signal having a power matching that entry is received, the control word at the address just written can be retrieved and stored in control register 32 to cause the necessary attenuation or gain mapped to that control word to be imposed so as to achieve nominal power on line 16.

Typically, the entire attenuation table's collection of all control words is built up in RAM memory (not shown in FIG. 1), and then burned into the EPROM attenuation table 40.

If the power level on line 16 measured in step 56 is not the desired nominal power level, then the control word generator cycles through each of a plurality of control words and repeats the process of measuring the power on line 16 and comparing it to the nominal power level for each control word, as represented by the loop between steps 56 and 60.

When a control word is found which results in the desired attenuation, the loop is exited to step 58, and the control word which resulted in achieving nominal power and the input power level on line 14 is recorded in an entry in the attenuation table being built.

Next, the power level of the signal on line 14 is increased, as represented by step 62. Then test 64 is performed to determine if the power level of the input signal has reached its upper limit. If not, processing is vectored back to step 54, and the process is repeated of finding a control word that causes the correct amount of attenuation or gain to be applied which achieves the desired nominal power level on line 16. To find this new control word, the control word generator cycles through a plurality of control words and measures the power on line 16 for each one until the correct control word is found.

The process of FIGS. 2A and 2B is repeated for all the different power levels of signals that might appear on line 14 until a complete table of control words is generated, as indicated by test 64 determining that the maximum power level has been reached. Step 66 is then performed write the table of control words so found into EPROM attenuation table 40.

Referring to FIG. 3, there is shown a block diagram of the preferred embodiment of a control word generator. Register 70 stores the inverse of the nominal power level that is desired. So if the desired nominal power is 0.125 dBm, register 70 stores the quantity 1/0.125 which is labelled 1/B in the diagram. Line 22 carries the power estimate value A generated by the power measurement circuit 20 in FIG. 1. A multiplier 72 multiplies the quantity in register 70 1/B times the power estimate value A on line 22 to calculate an error signal C on line 74. The error signal calculation is done at the rate defined by a refresh rate clock signal on line 95. The error signal represents the amount of dB attenuation or gain which is necessary to apply using attenuator/gain stage 10 to achieve the nominal power on line 16. What is happening is if the number on line 22 is expressed in dB as the quantity A (it is actually a linear number as is the inverse number in register 70) and the desired nominal power is 1/B and is expressed in dB, then multiplier 72 is calculating log(A)−log(B) which is equal to the amount of attenuation or gain in dB necessary to achieve nominal power because log (A/B)=log(A)−log(B).

A register 76 stores a linear number which translates in dB to the upper limit of the dynamic range of the AGC system of FIG. 1 when operating in open loop mode. That number plus the resolution or step size value stored in register 78 defines the overall dynamic range of the system. The numbers in registers 76 and 78 can be freely changed to alter the dynamic range and resolution of the automatic gain control system of FIG. 1. Each of registers 76 and 78 has a data output and a data input. Register 76 also has a reset input. Each of the registers will also have a clock or strobe input or any other known mechanism which controls the register to store whatever data is on the data input thereby replacing the contents of the register and altering the data appearing at the data output with the new data. The same is true for register 78 although this register does not need to be changed on every clock cycle of clock 85. As an example, recall that the value of register 76 needs to be changed on every clock cycle of clock 85, but the multiplier 86 does not operate instantaneously. After the multiplier 86 has had time to do its work of multiplying the output value on bus 93 times the step size on bus 95 to generate a new lower value to be stored in register 76, a strobe signal on line 87 goes active (this may simply be a delayed version of the clock signal on line 89) to cause the register 76 to store whatever value is on line 88.

Programmability of the step size and upper limit are provided by the input data paths 88 for the upper limit and 91 for the step size. Some suitable strobe signal is also used for register 78 to strobe the step size into the register.

Although the preferred embodiment of FIG. 1 is a hardware implementation, it could also be implemented equivalently in software with the software performing the same functions. In the preferred embodiment, the system of FIG. 1 is installed in a multimode cable modem receiver section which has a microprocessor which programs the numbers in registers 70, 76 and 78 at initialization time.

A comparator 80, compares the error signal on line 74 to the number stored in register 76 which starts out as the AGC upper limit of the dynamic range (a linear number but usually expressed in logarithmic dB). The comparator outputs a logic 1 on line 82 when the number D is greater than the error signal C. The error signal C on line 74 is refreshed at some rate we will call X. A counter 84 is incremented by one on each cycle of a $2^n$ clock 85 as long as the output of the comparator on line 82 is a logic 1. The output of this counter on line 26 is an n-bit control word which is stored in control word register 32 in FIG. 1. A reset signal on line 97 resets the count to zero each cycle of the refresh clock signal on line 95. The reset signal also resets the value of register 76 to the upper limit value on each cycle of the refresh clock on line 95.

Clock 85 also drives the inner loop comprised of registers 76, 78 and multiplier 86. Clock 85 cycles at a rate of $2^n$ times the rate at which the error signal on line 74 is refreshed. In other words, for each error signal value, the loop comprised of register 76, register 78 and multiplier 86 iterates $2^n$ times to reduce the number stored in register 76 in $2^n$ steps, each decrease being of the step size defined in register 78. The initial condition of register 76 is that it stores the AGC upper limit. Upon each iteration of the loop, multiplier 86 multiplies the step size stored in register 78 times the value stored in register 76 and stores the new reduced value in register 76 via line 88. Again, the multiplication of the linear numbers in registers 76 and 78, in the logarithmic world of dB constitutes a substraction of the step size in dB from the value stored in register 76, expressed in dB, on each iteration of the loop. Each iteration of the loop causes the value on line D to go lower by one step size. For each new value of D, comparator 80 makes a transition from logic 0 to logic 1 only if D is greater than C. As long as the comparator outputs a logic 1 on line 82, counter 84 increments at the rate of the $2^n$ clock 85. When D finally gets smaller than the error signal C, the output from the comparator on line 82 transitions to logic 0 and incrementation of counter 84 stops. That is the correct control word for the current value of the error signal on line 74.

This new control word causes the attenuation or gain value imposed by attenuator 10 to change which, in turn, changes the value of the power estimate signal B on line 22. This alters the value of C which is then compared to the value of D, and the process repeats to find a new control word for the new value of the error signal. The control word which results when the error signal C has dropped to zero is the final control word for the current level of input power. This process is repeated for each level of input power until the entire attenuation table is completed.

Although the invention has been disclosed in terms of the preferred and alternative embodiments disclosed herein, those skilled in the art will appreciate possible alternative embodiments and other modifications to the teachings disclosed herein which do not depart from the spirit and scope of the invention. All such alternative embodiments and other modifications are intended to be included within the scope of the claims appended hereto.

What is claimed is:

1. A control word generator, comprising:
a power estimate input for receiving a power signal expressed in dB;
a threshold register for storing a number equal to the inverse of a desired nominal power, expressed in dB, said register having an output;
a first multiplier having a first input coupled to said power estimate input and having a second input coupled to said output of said threshold register and having an output at which an error signal appears, and having an input to receive a refresh clock signal, and functioning to multiply the values at said first and second inputs each time a refresh clock signal makes one cycle;
a resolution clock having an output at which a clock signal appears which cycles at a rate 2n times the rate of said refresh clock;
an upper limit register having a data output and a data input and having a reset input for storing a number equal to an upper limit of dynamic range, expressed in dB, and having means for controlling when data at said input is stored in said upper limit register;
a step size register having a data output and a data input for storing a number equal to the desired resolution or step size by which the value stored in said upper limit register is to be decremented and having means for controlling when data at said input is stored in said upper limit register;
a second multiplier having a first input coupled to said data output of said upper limit register, and having a second input coupled to said output of said step size register, and having a clock input coupled to said output of said resolution clock and having an output coupled to said data input of said upper limit register;
a reset input coupled to said reset input of said upper limit register;
a comparator having a first data input coupled to said data output of said upper limit register and having a second input coupled to said output of said first multiplier to receive said error signal and having an output at which a signal appears which is logic one when the output of said upper limit register is greater than said error signal and is logic zero when the output of said upper limit register is less than said error signal;
a counter having a gating input coupled to said output of said comparator and having a clock input coupled to said output of said resolution clock and having a reset input coupled to said reset input, and having a control word output and functioning to increment on each clock cycle of said resolution clock so long at the value output from said comparator is logic 1.

2. A control word generator comprising:
means for determining once every period of a refresh clock the amount of attenuation that is necessary to reduce the amount of a power estimate signal to the value of a nominal power and outputting that amount of attenuation as an error signal;
means for establishing a reference value once during every cycle of a resolution clock, said reference value being derived from an upper limit value in dB which establishes the dynamic range of said control word generator and a step size value, and for decrementing said reference value by the value of said step size once every cycle of a resolution clock;
means for comparing the value of said error signal to the value of said reference value during every cycle of said resolution clock, and so as said reference value is greater than said error signal, incrementing at the rate of said resolution clock a counter which generate a control word.

3. A process for generating a control word comprising the steps of:

A control word generator comprising:
determining once every period of a refresh clock the amount of attenuation that is necessary to reduce the amount of a power estimate signal to the value of a nominal power and outputting that amount of attenuation as an error signal;
establishing a reference value once during every cycle of a resolution clock, said reference value being derived from an upper limit value in dB which establishes the dynamic range of said control word generator and a step size value, and for decrementing said reference value by the value of said step size once every cycle of a resolution clock;

comparing the value of said error signal to the value of said reference value during every cycle of said resolution clock, and so long as said reference value is greater than said error signal; and incrementing at the rate of said resolution clock a counter which generate a control word.

4. A system comprising:

an analog attenuator having an input to receive signals to be attenuated and a control signal input;

an analog to digital converter coupled to digitize the output of said analog attenuator;

a power measurement circuit for measuring the power of the signal output by said analog to digital converter and output a power estimate signal;

a control word generator means for receiving said power estimate signal and generating a control word;

a loop filter coupled to receive said control word and filter it;

a control word register for storing the filtered control word output from said loop filter;

a switch means having two states and connected so as to supply the output of said loop filter to a data input of said control word register in a first state and to decouple said control word register from said loop filter in a second state;

a memory for storing a table of control words and having an output coupled to a data input of said control word register;

a means coupled to a data output of said control word register for converting the digital value of said control word to a pulse train having a duty cycle proportional to the value of said control word; and means for integrating said pulse train to generate an analog attenuation control voltage and coupling said control voltage to said control signal input of said attenuator.

5. A process for generating a control word table using the following apparatus:

an analog attenuator having an input to receive signals to be attenuated and a control signal input;

an analog to digital converter coupled to digitize the output of said analog attenuator;

a power measurement circuit for measuring the power of the signal output by said analog to digital converter and output a power estimate signal;

a control word generator means for receiving said power estimate signal and generating a control word;

a loop filter coupled to receive said control word and filter it;

a control word register for storing the filtered control word output from said loop filter;

a switch means having two states and connected so as to supply the output of said loop filter to a data input of said control word register in a first state and to decouple said control word register from said loop filter in a second state;

a memory for storing a table of control words and having an output coupled to a data input of said control word register;

a means coupled to a data output of said control word register for converting the digital value of said control word to a pulse train having a duty cycle proportional to the value of said control word; and means for integrating said pulse train to generate an analog attenuation control voltage and coupling said control voltage to said control signal input of said attenuator;

said process comprising the steps of:

1) applying an input signal to be attenuated having some arbitrary 9 power level to an input of said analog attenuator;

2) establishing an initial value of said control word and using said initial value to generate said analog attenuation control voltage so as cause said analog attenuator to attenuate the signal at said input of said analog attenuator by some unknown amount;

3) measuring the power of the output signal from said attenuator and comparing said measured power to a desired nominal power to determine if the current value of said control word has caused an attenuation to achieve the desired nominal power;

4) if the attenuation is such as to not achieve the desired nominal power, altering the control word and repeating the process of step 2;

5) repeating steps 3 and 4 until a value for said control word has been found which causes the attenuation of said analog attenuator to be such as to alter the power of said input signal to match the desired nominal power;

6) writing the control word which caused said nominal power to be achieved into an attenuation table along with the input signal power level into a memory;

7) incrementing the power level of said input signal and applying the signal to an input of said attenuator;

8) determining if the power level of the input signal has reached an upper limit;

9) if not, repeating steps 2 through 8 until the power level has reached an upper level;

10) when said input signal has reached an upper level, writing the control words and input power levels associated with each control word into a nonvolatile memory.

6. A method for developing a control word table for controlling an analog attenuator/amplifier to apply a variable amount of attenuation or gain in accordance with the value of said control word comprising the steps of:

establishing an input power level and an initial value for a control word and attenuating or amplifying an input signal having some power level with said analog variable attenuator/amplifier so as to apply some positive or negative gain according to said initial value for said control word;

measuring the output power of the signal output by said variable attenuator/amplifier;

using a control word generator to iteratively derive a control word, which, when converted to a control signal to control the level of attenuation/amplification of said analog variable attenuator/amplifier, will cause the input signal power to be attenuated or amplified to the nominal power level;

recording that control word;

incrementing the input signal power and repeating the process to derive a new control word and recording that control word; and repeating the entire process for each level of expected input signal powers.

* * * * *